US009111718B2

(12) United States Patent
Merte

(10) Patent No.: US 9,111,718 B2
(45) Date of Patent: Aug. 18, 2015

(54) METHOD FOR MATCHING THE IMPEDANCE OF THE OUTPUT IMPEDANCE OF A HIGH-FREQUENCY POWER SUPPLY ARRANGEMENT TO THE IMPEDANCE OF A PLASMA LOAD AND HIGH-FREQUENCY POWER SUPPLY ARRANGEMENT

(71) Applicant: TRUMPF Huettinger GmbH + Co. KG, Freiburg (DE)

(72) Inventor: Rolf Merte, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 11 days.

(21) Appl. No.: 14/087,500

(22) Filed: Nov. 22, 2013

(65) Prior Publication Data

US 2014/0145636 A1    May 29, 2014

Related U.S. Application Data

(63) Continuation of application No. PCT/DE2012/100142, filed on May 16, 2012.

(30) Foreign Application Priority Data

May 24, 2011    (DE) .......................... 10 2011 076 404

(51) Int. Cl.
*H05B 41/36*    (2006.01)
*H01J 37/24*    (2006.01)
(Continued)

(52) U.S. Cl.
CPC ......... *H01J 37/241* (2013.01); *H01J 37/32174* (2013.01); *H01J 37/32183* (2013.01); *H03H 7/40* (2013.01); *H05H 1/46* (2013.01); *H05H 2001/4682* (2013.01)

(58) Field of Classification Search
CPC ........... H03H 7/38; H03H 7/74; H03H 11/30; H01J 37/321; H01J 37/32183
USPC ............................................. 315/224; 326/30
See application file for complete search history.

(56) References Cited

U.S. PATENT DOCUMENTS 4,629,940 A    12/1986  Gagne
4,759,131 A    7/1988   Fend
(Continued)

FOREIGN PATENT DOCUMENTS

DE    3514655 A1    10/1985
DE    3615836 C2    1/1987
(Continued)

OTHER PUBLICATIONS

International Search Report from corresponding PCT Application No. PCT/DE2012/100142, mailed Jan. 17, 2013, 6 pages.

*Primary Examiner* — Don Le
(74) *Attorney, Agent, or Firm* — Fish & Richardson P.C.

(57) ABSTRACT

A method for matching the impedance of the output impedance of a high-frequency power supply arrangement to the impedance of a plasma load includes, in a first impedance matching mode, matching the impedance of the output impedance of the high-frequency power supply arrangement by changing the frequency of the high-frequency signal produced. If the frequency is outside a specified frequency range, in a second impedance matching mode the impedance of the output impedance of the high-frequency power supply arrangement is matched by mechanically or electrically modifying a circuit which is arranged downstream of the high-frequency signal producer.

22 Claims, 2 Drawing Sheets

(51) Int. Cl.
*H01J 37/32* (2006.01)
*H03H 7/40* (2006.01)
*H05H 1/46* (2006.01)

(56) References Cited

U.S. PATENT DOCUMENTS

| | | | |
|---|---|---|---|
| 4,965,607 A | | 10/1990 | Wilkins |
| 5,474,648 A | * | 12/1995 | Patrick et al. .................. 438/10 |
| 5,654,679 A | | 8/1997 | Mavretic |
| 5,688,357 A | | 11/1997 | Hanawa |
| 5,936,481 A | * | 8/1999 | Fujii ............................ 333/17.3 |
| 6,511,584 B1 | | 1/2003 | Szczyrbowski |
| 8,040,068 B2 | | 10/2011 | Coumou |
| 8,294,370 B2 | | 10/2012 | Kadrnoschka |
| 2003/0087044 A1 | | 5/2003 | Willms |
| 2003/0196601 A1 | | 10/2003 | Murayama |
| 2005/0061442 A1 | | 3/2005 | Higashiura |
| 2006/0039440 A1 | | 2/2006 | Schwandt |
| 2006/0220656 A1 | | 10/2006 | Tanaka |
| 2007/0194628 A1 | | 8/2007 | Kirchmeier |
| 2010/0026202 A1 | | 2/2010 | Siessegger |
| 2010/0270141 A1 | | 10/2010 | Carter |
| 2012/0097524 A1 | * | 4/2012 | Pipitone et al. ............ 204/192.1 |
| 2014/0091875 A1 | * | 4/2014 | Shimomoto et al. ......... 333/17.3 |
| 2014/0097751 A1 | * | 4/2014 | Thomas et al. .......... 315/111.21 |

FOREIGN PATENT DOCUMENTS

| | | |
|---|---|---|
| DE | 4119738 C2 | 12/1992 |
| DE | 4122624 A1 | 1/1993 |
| DE | 69602116 T2 | 2/1995 |
| DE | 19963282 A1 | 12/1999 |
| DE | 10154229 B4 | 8/2004 |
| DE | 102004039082 A1 | 2/2006 |
| DE | 102004023750 B4 | 8/2007 |
| DE | 60219580 T2 | 12/2007 |
| DE | 102006025736 A1 | 12/2007 |
| DE | 102006058538 A1 | 6/2008 |
| DE | 102006005128 A1 | 9/2008 |
| DE | 102007036592 A1 | 2/2009 |
| DE | 102010005799 A1 | 11/2010 |
| DE | 102009054449 A1 | 5/2011 |
| EP | 155496 A2 | 2/1991 |
| EP | 840350 A2 | 6/1998 |
| EP | 795890 B1 | 4/2009 |
| WO | 8808645 A1 | 11/1988 |
| WO | 2010031421 A1 | 3/2010 |

* cited by examiner

METHOD FOR MATCHING THE IMPEDANCE OF THE OUTPUT IMPEDANCE OF A HIGH-FREQUENCY POWER SUPPLY ARRANGEMENT TO THE IMPEDANCE OF A PLASMA LOAD AND HIGH-FREQUENCY POWER SUPPLY ARRANGEMENT

TECHNICAL FIELD

The invention relates to a method for matching the impedance of the output impedance of a high-frequency power supply arrangement to the impedance of a plasma load and a high-frequency power supply arrangement.

BACKGROUND

High-frequency power supply arrangements generally produce a high-frequency power signal at a frequency of >3 MHz, in order to thereby excite and maintain a plasma in a plasma chamber. High-frequency power supply arrangements generally have a high-frequency generator or a high-frequency signal producer. An impedance matching network is often arranged downstream of the high-frequency signal producer in order to match the output impedance of the high-frequency signal producer to the impedance of the plasma load.

Impedance matching networks are generally arranged outside the high-frequency signal producer. The output impedance of the high-frequency signal producer is generally adjusted to 50Ω so that this can be connected to the impedance matching network by means of conventional high-frequency cables. The impedance matching network matches the impedance of the plasma load to the 50Ω connection of the high-frequency signal producer.

Impedance matching networks often have capacitors, whose capacitance value can be mechanically adjusted by a capacitor plate being moved. An impedance matching is therefore carried out relatively slowly.

Furthermore, the complexity in the prior art is relatively high in order to adjust the output impedance of the high-frequency signal producer to 50Ω.

SUMMARY

An object of the present invention is to provide a method for impedance matching which can be carried out, on the one hand, with few components and which, on the other hand, enables rapid impedance matching.

This object is achieved according to the invention with a method for matching the impedance of the output impedance of a high-frequency power supply arrangement to the impedance of a plasma load. In some implementations, the method comprises:
 a. producing a high-frequency signal by means of a high-frequency signal producer;
 b. in a first impedance matching mode, matching the impedance of the output impedance of the high-frequency power supply arrangement exclusively by changing the frequency of the high-frequency signal produced;
 c. monitoring the frequency of the high-frequency signal produced with regard to whether it is in a predetermined frequency range;
 d. if the frequency is outside the predetermined frequency range, in a second impedance matching mode matching the impedance of the output impedance of the high-frequency power supply arrangement by means of mechanical and/or electrical modification of a circuit which is arranged downstream of the high-frequency signal producer.

According to the invention, the impedance matching is thus carried out in two steps. The modification of the frequency of the high-frequency signal produced leads to a modification of the output impedance. By changing the frequency of the high-frequency signal, a very rapid change of the output impedance can be brought about. As long as the frequency of the high-frequency signal is in a predetermined frequency range which is suitable for producing and maintaining a plasma, it is therefore possible to carry out an impedance matching simply by changing the frequency of the high-frequency signal. However, if the frequency has to be changed in such a manner that, for an impedance matching to the plasma load, the frequency is outside the predetermined frequency range, a second step of the impedance matching is carried out. In this instance, an impedance matching is carried out by means of a circuit which is arranged downstream of the high-frequency signal producer. This type of impedance matching has to be carried out relatively seldom, for which reason this type of impedance matching can also be carried out somewhat more slowly. When, owing to the modification of the circuit arranged downstream, such a situation is brought about that an impedance matching can be carried out again (exclusively) by means of frequency variation in a frequency range which is suitable for the generation or maintenance of plasma, the impedance matching is carried out again exclusively by the modification of the frequency of the high-frequency signal.

In the method according to the invention, it is possible to achieve a value of 50Ω without the interposed impedance matching. An impedance matching can be carried out by exclusive impedance matching by means of frequency change and if necessary change of the circuit arranged downstream.

The impedance matching can be carried out in the second impedance matching mode until the frequency of the high-frequency signal is within a permissible frequency range and, subsequently, the impedance matching can be carried out in the first impedance matching mode. In this instance, it is again monitored whether the frequency of the high-frequency signal produced is within a predetermined frequency range. The predetermined frequency range may in this instance be the same frequency range which was used before the impedance matching was carried out in the second impedance matching mode. However, another frequency range may also be predetermined. For example, the frequency range may be predetermined which was used as a permissible frequency range in the second impedance matching mode. The permissible frequency range may also correspond to the predetermined frequency range, which was used before the second impedance matching mode was carried out.

The high-frequency signal can be produced by means of a self-exciting high-frequency signal producer, the frequency of the high-frequency signal being adjusted automatically in accordance with the plasma load. In a self-exciting high-frequency signal producer, the output of the high-frequency signal producer may be coupled to the input of the high-frequency signal producer by means of a feedback network. The feedback network directs a portion of the power of the high-frequency signal produced at the output of the high-frequency signal producer back to the input thereof. The phase position and amplitude of the feedback signal may be adjusted in such a manner that a positive feedback occurs and the high-frequency signal producer produces a power with a stable amplitude. The frequency of the high-frequency signal produced may thus be adjusted automatically, that is to say, independently of an external clock signal, in dependence on the impedance of the plasma load. In principle, however, it is also conceivable to adjust the frequency of the high-frequency signal produced actively by means of a regulation or control system. However, this would be linked with increased circuit and control complexity.

As mentioned, a portion of the high-frequency power produced by the high-frequency signal producer can be coupled to the input of the high-frequency signal producer by means of a feedback network. In this manner, the high-frequency signal producer can very rapidly be adjusted to the required frequency. In particular this adjustment is carried out much more rapidly compared with a measurement and digitisation of signals which describe the impedance of the plasma load and subsequent digital control of the high-frequency signal producer. Examples of self-exciting high-frequency signal producers are described in: "Tietze, Schenk: Halbleiter-Schaltungstechnik" (Semi-Conductor Circuit Technology), 9th Edition 1991, pages 459 to 466. The high-frequency signal producers are also referred to therein as "signal generators LC oscillators".

The second impedance matching mode can be carried out when the frequency deviates by more than 10% from a predetermined base frequency. In this manner, the base frequency can be kept relatively constant. Frequency changes remain small. Consequently, the influence of the plasma process owing to a change of the frequency of the high-frequency signal remains small. This leads to homogeneous plasma processes.

In the second impedance matching mode, at least one reactance of the circuit arranged downstream can be mechanically connected to it or disconnected from it. This is advantageous for large capacitance changes of the circuit arranged downstream. This may be advantageous in particular with large but rather infrequent load changes.

Furthermore, in the second impedance matching mode, at least one reactance of the circuit arranged downstream can be electronically connected to it or disconnected from it. This procedure is particularly advantageous for small capacitance changes. Owing to the action of electronically connecting to or disconnecting from the circuit, the capacitance change can be carried out very much more rapidly. If there is provision for both a mechanical and an electronic action of electronically connecting to or disconnecting from the circuit, particular advantages are achieved. Both large and small load changes often occur in plasma loads. In both cases, an optimum impedance matching can be carried out.

In the second impedance matching mode, the capacitance of at least one capacitor of the circuit arranged downstream can be changed. For example, this may be carried out by means of a mechanical adjustment of at least one capacitor plate of the capacitor. A stepless modification of the capacitance and consequently the output impedance is thereby enabled. A very narrow frequency range of the high-frequency signal can thereby be maintained. In particular, the frequency range may be kept almost constant.

The high-frequency signal produced by the high-frequency signal producer can be supplied directly to the load without the use of a high-frequency cable which is matched to 50Ω. It is thereby possible to assemble or arrange the high-frequency power supply arrangement very close to the plasma chamber. This is in particular possible owing to low losses and consequently lesser cooling measures. The smaller construction also promotes such an arrangement. Owing to the method according to the invention, it is in particular possible to avoid a multiple-impedance conversion. In particular, it is not necessary to carry out a transformation from a high-frequency signal producer impedance to a cable impedance and then to a plasma impedance. The output impedance of the high-frequency power supply arrangement can be transformed directly to the plasma impedance.

The high-frequency signal producer may have electrical switches and be operated in switching mode. Small losses can thereby be achieved with respect to high-frequency signal producers which are operating in boost mode. This also allows the high-frequency signal excitation arrangement to be fitted close to the plasma chamber. Multiple impedance conversion can thereby be prevented.

The high-frequency signal producer can be operated in switching mode. This means, in place of amplifying vacuum tubes or amplifying transistors, switching elements (switches), in particular transistors or transistor modules which operate in switching mode, are used. The loss energy can thereby be reduced. An assembly close to the plasma chamber can thus be simplified since less loss energy has to be discharged. The switches can be switched on at voltages of <50% of the voltage which is supplied to the high-frequency signal producer. High-frequency signal producers are generally supplied with power by a direct-current voltage. This voltage, which is also referred to as intermediate circuit voltage, is often between 100 and 800 V in high-frequency power supply arrangements for supplying plasma loads. Owing to reactances of the load, together with the impedance matching and optionally other reactances, however, there is often a significantly higher and, with appropriate control, also significantly lower voltage at the switches. If it is ensured, owing to the correct adjustment, that during switching-on the voltage is <50% than the intermediate circuit voltage, the losses in the switches can thus be kept low. The switches are thereby subjected to little load, which increases the service-life. Furthermore, the cooling is less complex to operate.

The high-frequency signal producer may be operated in switching mode and the switches can be switched on at voltages>5% of the voltage which is supplied to the high-frequency signal producer. In particular with plasma loads, very rapid load changes may occur. If, in the matched range, precisely at a voltage of zero volt, a switching operation were to be carried out via the switches, the losses would be minimal. However, with a load change, a switching at negative voltage could occur. This may under some circumstances be damaging for the switches or lead to a very much higher production of loss energy in the switches. In order to ensure sufficient reserve and reliable management of such load changes, it is advantageous to switch on at voltages>0 volt, in particular >5% of the direct-current voltage supplied to the high-frequency signal producer.

The predetermined frequency range may be adjustable by a user. The method is thereby particularly user-friendly. An adjustment which is very well adapted to the plasma processes, in particular when implementing new plasma processes, is also possible.

It is further conceivable for the predetermined frequency range to be automatically adjusted. This is particularly advantageous for the implementation of known plasma processes.

The predetermined frequency range can be automatically adjusted in dependence on the circuit arranged downstream. It is thereby possible for knowledge relating to the plasma load and the circuit which is arranged downstream to be incorporated in the adjustment of the frequency range. An improved process management is thereby possible.

Furthermore, the predetermined frequency range can be adjusted in a fuzzy manner. It is thereby possible to react to both slow and rapid load changes in a correspondingly gentle manner.

The predetermined frequency range can be adjusted with hysteresis. In particular when the modification of the circuit which is arranged downstream is carried out by reactances being switched over, a hysteresis adjustment is advantageous in order, with a plasma load which brings about an operation close to an end of the predetermined frequency range, to prevent an excessively frequent change between the first and second impedance matching mode.

The load, together with the circuit which is arranged downstream, may have a resonance frequency and the frequency of the high-frequency signal produced may be adjusted to be equal to or below the resonance frequency. It is thereby possible to achieve a particularly low-loss control of the switching elements of the high-frequency signal producer involving little loading.

The monitoring of the frequency of the high-frequency signal produced and the mechanical and/or electrical modification of the circuit arranged downstream of the high-frequency signal producer can be carried out by means of a controller in which the adjustment of the frequency range is carried out via an electronic interface. A particular degree of user-friendliness is thereby achieved. It is further possible to match a large number of many different plasma loads.

It is possible to detect the impedance of the plasma load and the predetermined frequency range can be automatically adjusted in accordance with the plasma load. It is thereby possible to detect a plasma which has not ignited or has only partially ignited. The frequency range can then be adjusted in such a manner that a complete ignition of the plasma can be achieved.

The scope of the invention further includes a method for igniting and operating a plasma load with a high-frequency power supply arrangement in which, when an ignited plasma has been detected, a method according to the invention for impedance matching is carried out and, when a plasma which has not been ignited is detected, the mechanical and/or electrical modification of a circuit which is arranged downstream of the high-frequency signal producer is prevented and/or the frequency of the high-frequency signal is adjusted to a specific frequency. If there then continues to be no ignition of the plasma, it is possible to sequentially adjust other frequencies for the high-frequency signal produced until ignition is carried out. Reliable ignition can thus be enabled. At the same time, it is possible to prevent the high-frequency power supply arrangement from unsuccessfully seeking an appropriate modification whilst the plasma has not yet ignited. The specific frequencies can be fixedly predetermined or can be predetermined by the user. It is also possible to adjust the frequencies automatically in dependence on an established impedance, reflected power or a harmonic spectrum. These measures may ensure reliable ignition and subsequently reliable and rapid impedance matching.

The invention further relates to a high-frequency power supply arrangement for supplying a plasma load with a high-frequency signal, comprising a high-frequency signal producer for producing the high-frequency signal, a circuit which is arranged downstream of the high-frequency signal producer and a monitoring device for monitoring the frequency of the high-frequency signal produced, the monitoring device controlling the circuit arranged downstream in order to change the impedance of the circuit which is arranged downstream when the frequency of the high-frequency signal leaves a predetermined frequency range. The method according to the invention can be implemented with such a high-frequency power supply arrangement.

The output of the high-frequency signal producer may be coupled to the input of the high-frequency signal producer, in particular by means of a feedback network. The feedback network directs a portion of the power of the high-frequency signal produced at the output of the high-frequency signal producer back to the input thereof. The phase position and amplitude of the feedback signal may be adjusted in such a manner that a positive feedback loop is achieved and the high-frequency signal producer produces a power with a stable amplitude. An external adjustment of the frequency of the high-frequency signal is not necessary.

The high-frequency signal producer may be connected to a direct-current source and be operated in switching mode. The power loss can thereby be reduced.

Other features and advantages of the invention will be appreciated from the following description of embodiments of the invention with reference to the Figures of the drawings, which show inventively significant details, and the claims. The individual features may be implemented individually per se or together in any combination in a variant of the invention.

Preferred embodiments of the invention are schematically illustrated in the drawings and are explained in greater detail below with reference to the Figures of the drawings, in which:

DETAILED DESCRIPTION

Figure 1:
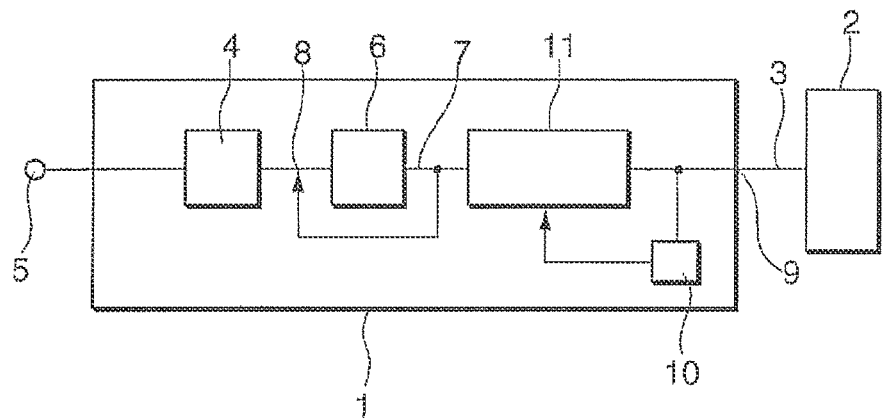
FIG. 1 is a highly schematic illustration of a high-frequency power supply arrangement which is connected to a plasma load.

FIG. 1 shows a high-frequency power supply arrangement 1 which is connected to a plasma load 2. The connection 3 is a very short connection. In particular, the connection 3 is not a high-frequency cable which is adjusted to 50Ω. The plasma load 2 is connected directly, that is to say, immediately, to the high-frequency power supply arrangement 1.

The high-frequency power supply arrangement 1 has a direct-current source 4 which is connected to a network connection 5. The direct current source 4 supplies a high-frequency signal producer 6 with a direct-current voltage. The high-frequency signal producer 6 preferably has one or more switching elements (switches) and can be operated in switching mode. The output 7 of the high-frequency signal producer is further advantageously back-coupled to the input 8. Self-excitation is thereby possible. In particular, it is possible in this manner to carry out an automatic adjustment of the frequency of the high-frequency signal produced by the high-frequency signal producer 6.

If the impedance of the plasma load 2 changes, in a first impedance matching mode an impedance matching can be carried out simply by the frequency of the high-frequency signal produced by the high-frequency signal producer 6 being changed. This is because the output impedance thereby changes at the output 9 of the high-frequency power supply arrangement 1. Owing to a monitoring device 10, which may be constructed as a controller, the frequency of the high-frequency signal produced is monitored. If the monitoring device 10 determines that the frequency of the high-frequency signal leaves a predetermined frequency range, a circuit 11 which is arranged downstream of the high-frequency signal producer 6 and which can also be referred to as an impedance matching network, is mechanically and/or electrically modified so that the impedance at the output 9 also changes. This is carried out until an exclusive impedance matching to the impedance of the plasma load 2 can be carried out again by means of a frequency change of the high-frequency signal.

Figure 2:
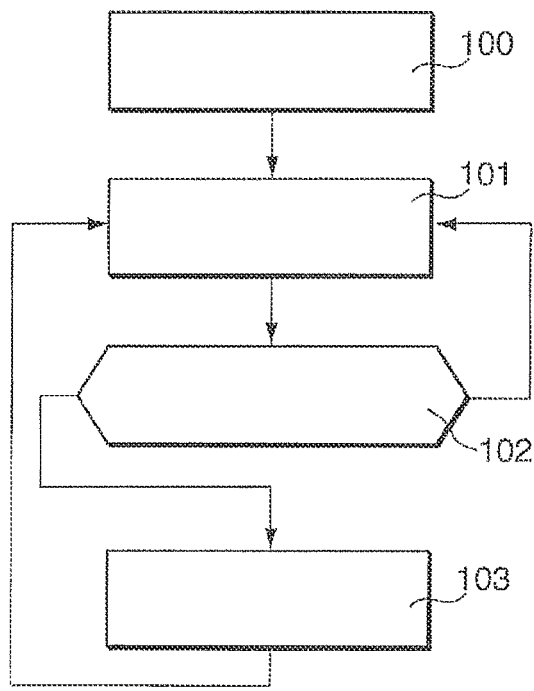
FIG. 2 is a first flow chart to illustrate the method according to the invention.

This method is explained again below with reference to FIG. 2. In a first method step 100, a high-frequency signal is produced by means of a high-frequency signal producer.

In a first impedance matching mode, in the method step 101, an impedance matching of the output impedance of the high-frequency power supply arrangement is carried out exclusively by the frequency of the high-frequency signal produced being changed. In the method step 102, it is monitored whether the frequency of the high-frequency signal produced is in a predetermined frequency range. If it is in a predetermined frequency range, the sequence returns to the method step 101. However, if the frequency is outside the predetermined frequency range, the sequence moves to the method step 103. Therein, in a second impedance matching mode, an impedance matching of the output impedance of the high-frequency power supply arrangement is carried out by means of mechanical and/or electrical modification of a circuit which is arranged downstream of the high-frequency signal producer until the frequency of the high-frequency signal is again in a permissible frequency range. If this is the case, the method step 101 is carried out again.

Figure 3:
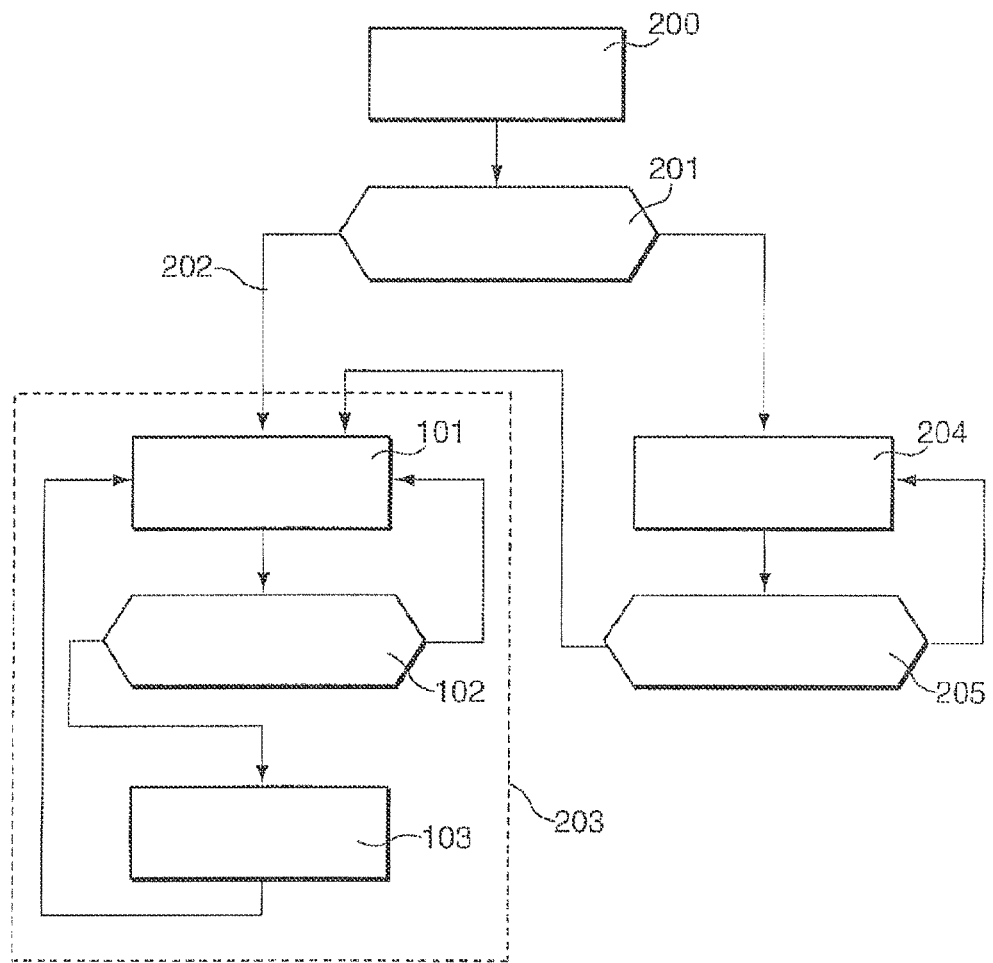
FIG. 3 is a second flow chart to explain a method for igniting and operating a plasma load.

In FIG. 3, a method for igniting and operating a plasma load with a high-frequency supply arrangement is explained. In a method step 200, a high-frequency signal is first produced. In the method step 201, it is verified whether the plasma in the plasma chamber is ignited, that is to say, whether a plasma load is present. If this is the case, the sequence moves in accordance with the arrow 202 to the method according to block 203, the method in block 203 corresponding to the method described in FIG. 2 from the method step 101. However, if it is recognised in the method step 201 that a plasma is not ignited, the method step 204 is carried out again. Here, the circuit which is arranged downstream is mechanically and/or electrically modified so that it has a different impedance and/or the frequency of the high-frequency signal is adjusted to a determined frequency. In the step 205, it is again verified whether the plasma is ignited or not. If it is ignited, the procedure carries on to the block 203. If it is not ignited, the method step 204 is carried out again.

A number of embodiments of the invention have been described. Nevertheless, it will be understood that various modifications may be made without departing from the spirit and scope of the invention. Accordingly, other embodiments are within the scope of the following claims.

What is claimed is:

1. A method for matching the impedance of the output impedance of a high-frequency power supply arrangement to the impedance of a plasma load, the method comprising:
   producing a high-frequency signal using a high-frequency signal producer;
   in a first impedance matching mode, matching the impedance of the output impedance of the high-frequency power supply arrangement by changing the frequency of the high-frequency signal produced and without modifying a circuit which is arranged downstream of the high-frequency signal producer;
   monitoring the frequency of the high-frequency signal produced to determine whether the frequency is in a specified frequency range; and
   if the frequency is outside the specified frequency range, in a second impedance matching mode matching the impedance of the output impedance of the high-frequency power supply arrangement by mechanically or electrically modifying the circuit which is arranged downstream of the high-frequency signal producer,
   wherein the high-frequency signal producer is operated in a switching mode and one or more switches are switched on at voltages of less than 50% of the voltage which is supplied to the high-frequency signal producer.

2. A method for matching the impedance of the output impedance of a high-frequency power supply arrangement to the impedance of a plasma load, the method comprising:
   producing a high-frequency signal using a high-frequency signal producer;
   in a first impedance matching mode, matching the impedance of the output impedance of the high-frequency power supply arrangement by changing the frequency of the high-frequency signal produced and without modifying a circuit which is arranged downstream of the high-frequency signal producer;
   monitoring the frequency of the high-frequency signal produced to determine whether the frequency is in a specified frequency range; and
   if the frequency is outside the specified frequency range, in a second impedance matching mode matching the impedance of the output impedance of the high-frequency power supply arrangement by mechanically or electrically modifying the circuit which is arranged downstream of the high-frequency signal producer,
   wherein the high-frequency signal producer is operated in a switching mode and one or more switches are switched on at voltages of greater than 5% of the voltage which is supplied to the high-frequency signal producer.

3. A method for matching the impedance of the output impedance of a high-frequency power supply arrangement to the impedance of a plasma load, the method comprising:
   producing a high-frequency signal using a high-frequency signal producer;
   in a first impedance matching mode, matching the impedance of the output impedance of the high-frequency power supply arrangement by changing the frequency of the high-frequency signal produced and without modifying a circuit which is arranged downstream of the high-frequency signal producer;
   monitoring the frequency of the high-frequency signal produced to determine whether the frequency is in a specified frequency range; and
   if the frequency is outside the specified frequency range, in a second impedance matching mode matching the impedance of the output impedance of the high-frequency power supply arrangement by mechanically or electrically modifying the circuit which is arranged downstream of the high-frequency signal producer,
   wherein the monitoring of the frequency of the high-frequency signal produced and the mechanical and/or electrical modification of the circuit arranged downstream of the high-frequency signal producer is carried out using a controller in which the adjustment of the frequency range is carried out via an electronic interface.

4. A method for igniting and operating a plasma load with a high-frequency power supply arrangement, the method comprising:
   producing a high-frequency signal using a high-frequency signal producer and adjusting the frequency of the high-frequency signal to a specific frequency to ignite the plasma load;
   preventing modification of an impedance matching circuit which is arranged downstream of the high-frequency signal producer until an ignited plasma has been detected; and when an ignited plasma has been detected, performing impedance matching, including:
  in a first impedance matching mode, matching the impedance of the output impedance of the high-frequency power supply arrangement by changing the frequency of the high-frequency signal produced and without modifying a circuit which is arranged downstream of the high-frequency signal producer;
  monitoring the frequency of the high-frequency signal produced to determine whether the frequency is in a specified frequency range; and
  if the frequency is outside the specified frequency range, in a second impedance matching mode matching the impedance of the output impedance of the high-frequency power supply arrangement by mechanically or electrically modifying the impedance matching circuit which is arranged downstream of the high-frequency signal producer.

5. A high-frequency power supply arrangement for supplying a plasma load with a high-frequency signal, the high-frequency power supply arrangement comprising:
  a high-frequency signal producer for producing the high-frequency signal;
  a circuit which is arranged downstream of the high-frequency signal producer; and
  a monitoring device for monitoring the frequency of the high-frequency signal produced, wherein the monitoring device controls the circuit arranged downstream in order to change the impedance of the circuit which is arranged downstream when the frequency of the high-frequency signal leaves a specified frequency range,
  wherein an output of the high-frequency signal producer is coupled to an input of the high-frequency signal producer.

6. A high-frequency power supply arrangement for supplying a plasma load with a high-frequency signal, the high-frequency power supply arrangement comprising:
  a high-frequency signal producer for producing the high-frequency signal;
  a circuit which is arranged downstream of the high-frequency signal producer; and
  a monitoring device for monitoring the frequency of the high-frequency signal produced, wherein the monitoring device controls the circuit arranged downstream in order to change the impedance of the circuit which is arranged downstream when the frequency of the high-frequency signal leaves a specified frequency range,
  wherein the high-frequency signal producer is connected to a direct-current source and is configured to operate in a switching mode.

7. A method for matching the impedance of the output impedance of a high-frequency power supply arrangement to the impedance of a plasma load, the method comprising:
  producing a high-frequency signal using a high-frequency signal producer;
  in a first impedance matching mode, matching the impedance of the output impedance of the high-frequency power supply arrangement by changing the frequency of the high-frequency signal produced and without modifying a circuit which is arranged downstream of the high-frequency signal producer;
  monitoring the frequency of the high-frequency signal produced to determine whether the frequency is in a specified frequency range; and
  if the frequency is outside the specified frequency range, in a second impedance matching mode matching the impedance of the output impedance of the high-frequency power supply arrangement by mechanically or electrically modifying the circuit which is arranged downstream of the high-frequency signal producer,
  wherein the plasma load, together with the circuit which is arranged downstream, has a resonance frequency and the frequency of the high-frequency signal produced is adjusted to be equal to or below the resonance frequency.

8. The method of claim 7, wherein the impedance matching is carried out in the second impedance matching mode until the frequency of the high-frequency signal is within a permissible frequency range and, subsequently, the impedance matching is carried out in the first impedance matching mode.

9. The method of claim 7, wherein the high-frequency signal is produced using a self-exciting high-frequency signal producer, the frequency of the high-frequency signal being adjusted automatically based on the plasma load.

10. The method of claim 7, wherein a portion of the high-frequency power produced by the high-frequency signal producer is coupled to the input of the high-frequency signal producer by a feedback network.

11. The method of claim 7, wherein the second impedance matching mode is carried out when the frequency deviates by more than 10% from a specified base frequency.

12. The method of claim 7, wherein, in the second impedance matching mode, at least one reactance of the circuit arranged downstream is mechanically connected to the circuit or disconnected from the circuit.

13. The method of claim 7, wherein, in the second impedance matching mode, at least one reactance of the circuit arranged downstream is electronically connected to the circuit or disconnected from the circuit.

14. The method of claim 7, wherein, in the second impedance matching mode, the capacitance of at least one capacitor of the circuit arranged downstream is changed.

15. The method of claim 7, wherein the high-frequency signal produced by the high-frequency signal producer is supplied directly to the plasma load without the use of a high-frequency cable which is adjusted to 50Ω.

16. The method of claim 7, wherein the high-frequency signal producer is operated in switching mode.

17. The method of claim 7, wherein the specified frequency range is adjusted by a user.

18. The method of claim 7, wherein the specified frequency range is automatically adjusted.

19. The method of claim 7, wherein the specified frequency range is automatically adjusted based on the circuit arranged downstream.

20. The method of claim 7, wherein the specified frequency range can be adjusted in a fuzzy manner.

21. The method of claim 7, wherein the specified frequency range can be adjusted with hysteresis.

22. The method of claim 7, wherein the impedance of the plasma load is detected and the specified frequency range is automatically adjusted based on the plasma load.

* * * * *